United States Patent [19]

Colbourne et al.

[11] Patent Number: 5,798,859
[45] Date of Patent: Aug. 25, 1998

[54] METHOD AND DEVICE FOR WAVELENGTH LOCKING

[75] Inventors: Paul Colbourne, Nepean; Joseph Ip, Kanata; Neil Teitelbaum, Ottawa, all of Canada

[73] Assignee: JDS Fitel Inc., Nepean, Canada

[21] Appl. No.: 666,229

[22] Filed: Jun. 20, 1996

[51] Int. Cl.$^6$ .............................. G02F 1/03; G02B 27/14; G01B 9/02; H01S 3/13
[52] U.S. Cl. .................. 359/247; 359/260; 359/638; 356/352; 372/32
[58] Field of Search .................... 372/32, 18; 356/352, 356/346; 359/247, 260, 638

[56] References Cited

U.S. PATENT DOCUMENTS

| | | | |
|---|---|---|---|
| 4,309,108 | 1/1982 | Siebert | 356/352 |
| 4,856,899 | 8/1989 | Iwaoka et al. | 356/346 |
| 5,274,659 | 12/1993 | Harvey et al. | 372/94 |

FOREIGN PATENT DOCUMENTS

| | | |
|---|---|---|
| A0 001 714 | 5/1979 | European Pat. Off. |
| 0 479 118 A2 | 4/1992 | Germany. |
| 0 479 118 A3 | 4/1992 | Germany. |

OTHER PUBLICATIONS

Accuwave WLK-2 Wavelength Locker brochure; © 1994 Accuwave.

*Primary Examiner*—Georgia Y. Epps
*Assistant Examiner*—Evelyn A. Lester
*Attorney, Agent, or Firm*—Neil Teitelbaum & Associates

[57] ABSTRACT

A method and device for wavelength locking is provided, wherein an element having a wavelength dependent characteristic such as a Fabry Perot etalon is used to provide an output signal having an intensity that varies with wavelength. The intensity of a reference signal derived from an input signal is compared with an output from the Fabry Perot etalon to provide a feedback signal that corresponds to the frequency of the input signal. The system is calibrated before wavelength locking is performed to determine a ratio of intensities that determines a locked state or condition.

8 Claims, 4 Drawing Sheets

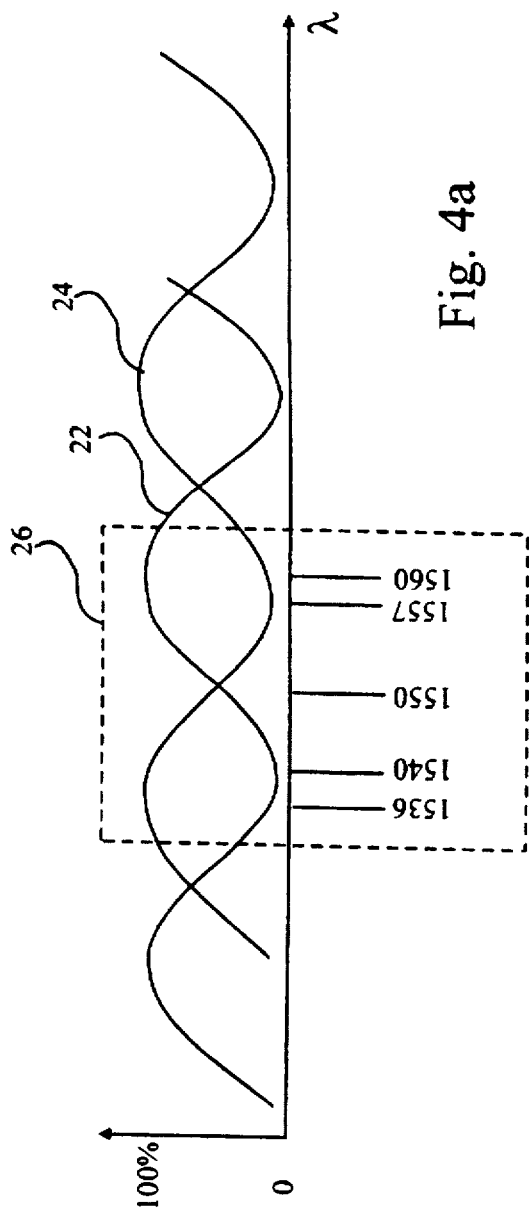
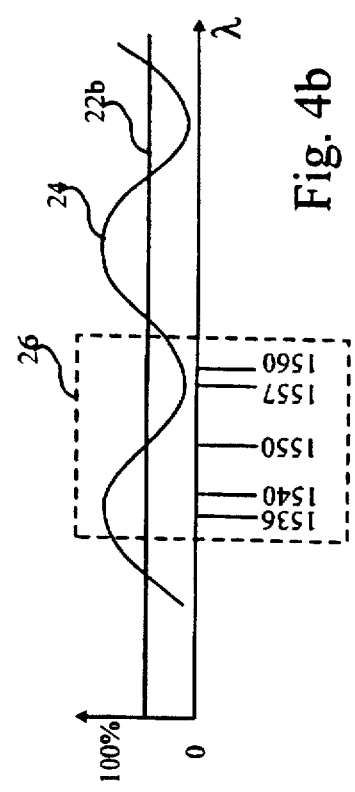

ature change. One such wavelength locking device is offered for sale by Accuwave of Santa Monica, Calif. U.S.A. By inputting a single frequency signal into the device, an output signal results with peaks on either side of a desired center wavelength. This device uses a lithium niobate block into which a volume hologram is written. The device is expensive owing to the high cost of the lithium niobate material and the difficulty in writing precision volume holograms. Furthermore, once a hologram is written into the material the grating is fixed and cannot be changed. Accuwave's device has thermo-electric temperature control and has a variance of about 7 pico meters per degree. Another limitation of this design is that it will only operate at a temperature of 15–40 degrees.

This invention provides a device and method for providing the basic function of the prior art device at less cost using an etalon or filter based device.

An optical element in the form of a Fabry Perot etalon is utilized; the element is a wavelength dependent device having an output characteristic, more particularly, an output amplitude response that varies with a changing wavelength of an input signal.

BRIEF DESCRIPTION OF THE DRAWINGS

Exemplary embodiments of the invention will now be described in conjunction with the drawings, in which:

FIG. 4a is a graph of two wavelength responses of the two optical elements shown in FIG. 1;

FIG. 4b is a graph of a wavelength response of a single etalon system in accordance with the invention;

FIG. 5 is a graph of wavelength responses in transmission and reflection for the device shown in FIG. 3; and, FIG. 6 is an illustration of a Fabry Perot etalon used in accordance with an embodiment of this invention.

DETAILED DESCRIPTION

Figure 1B:
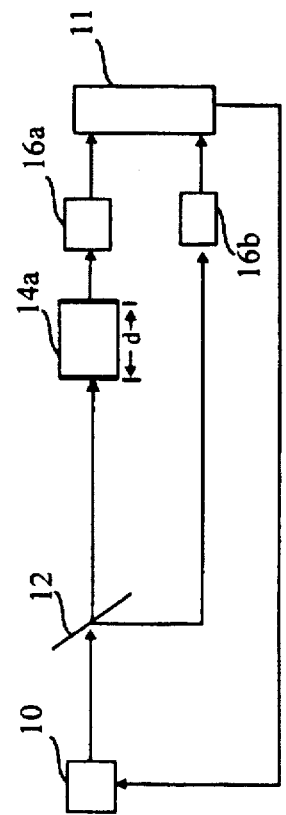
FIG. 1b is a schematic block diagram of a wavelength locking system similar to that in FIG. 1, and having only a single optical element having a periodic response.
Figure 1:
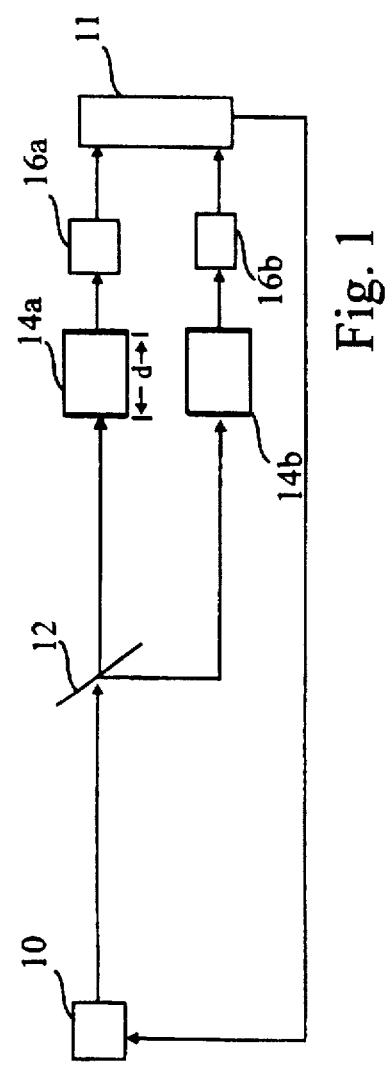
FIG. 1 is a schematic block diagram of a wavelength locking system having two optical elements having a periodic wavelength response.

Referring now to FIGS. 1 and 4a, a wavelength locking device as shown in FIG. 1 comprises two etalons 14a and 14b, having similar but different output responses. The output response 22 as shown in FIG. 4a for etalon 14a is illustrated by a curve having a periodic amplitude response that varies with wavelength. The free spectral range is shown to be 21 nm. and the free spectral range for the etalon 14b shown as output response 24 is 20 nm. The desired locking wavelength is 1550 nm which is where the output response 24 and output response 22 overlap. The window of interest 26 shown in dotted outline is between two peaks of respective responses 22 and 24. If the incoming wavelength remains in the window of interest 26, i.e. varying or drifting less than the distance between the two peaks, locking can be achieved.

Turning to FIG. 1, an input signal from a tunable laser 10 is directed toward the wavelength locking device. The input signal is split by a mirror 12, conveniently in a 50% ratio such that half of the input signal power is directed to etalon 14a, the remaining signal power being directed toward etalon 14b. Attached to the input and output faces of the etalons 14a and 14b are graded index (GRIN) lenses (not shown) for collimating and focusing light out of and into optical fibres coupled thereto. Typically, the optical fibres coupled to these lenses would be offset from the optical axes of these GRIN lenses so as to minimize back reflections. Detectors 16a and 16b are positioned to receive output signals with an intensity that is dependent upon the wavelength of the signals propagating within the respective etalons 14a and 14b. For example, when the input signal has a wavelength of 1550 nm, the detectors each receive a signal having the same intensity; however, when the input signal to the two etalons have a wavelength of 1551 un, detector 16a coupled to etalon 14a receives a signal having an intensity much greater than that at detector 16b coupled to etalon 14b which receives a signal having an intensity near zero. As the wavelength of the input signal changes toward 1550 nm from 1551 nm, the ratio of the detected signals becomes more balanced. Conversely as the wavelength of the input signal changes below 1550 nm the detector 16a coupled to etalon 14a receives a signal having a reduced intensity, while detector 16b coupled to etalon 14b receives a signal having an increased intensity. Therefore, by providing a feedback signal from the detectors to the tunable laser 10, the laser's output signal can be stabilized. Circuitry 11 compares the output signals provided by the detectors 16a and 16b and adjusts the tunable laser 10 in dependence upon the ratio of the detector output signals, thereby tuning the laser and locking it about a desired wavelength of 1550 nm.

Figure 1A:
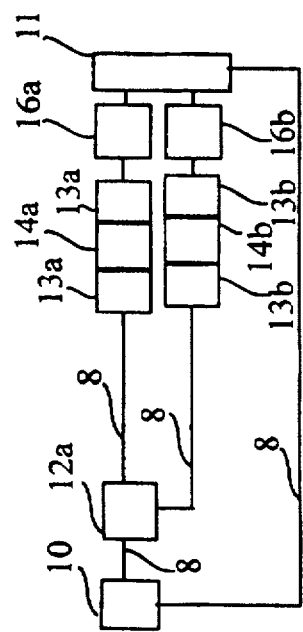
FIG. 1a is a schematic block diagram of a wavelength locking system similar to the one shown in FIG. 1 whereby optical fiber is used in place of the freespace configuration shown in FIG. 1.

The embodiment shown if FIG. 1a is shown having optical fibers 8 interconnecting optical components. The etalons 14a and 14b have collimating graded index lenses 13a and 13b respectively coupled to each etalon;

FIG. 1b shows an alternative embodiment wherein a single periodic optical element in the form of an etalon 14a is used to provide an output signal. As in FIG. 1 the input signal is split a a predetermined ratio by a mirror 12 to provide to signals. A first of these signals is provided to the etalon 14a, while a second portion of the input signal termed the second signal, is provided directly to the detector 16b. The output signal of the etalon 16a is provided to detector 16a; as FIG. 4b illustrates the intensity of light detected at the detectors 16a and 16b is approximately the same when the wavelength of the input signal is 1550 nm. Instead of comparing two signals whose intensity varies with periodically with wavelength as is done in the circuit of FIG. 1, a reference signal, in the form of the second signal, is compared with the first signal that varies in wavelength. By providing a reference signal derived from the input signal the accuracy the of system is essentially maintained when the intensity of the input signal fluctuates.

Figure 2:
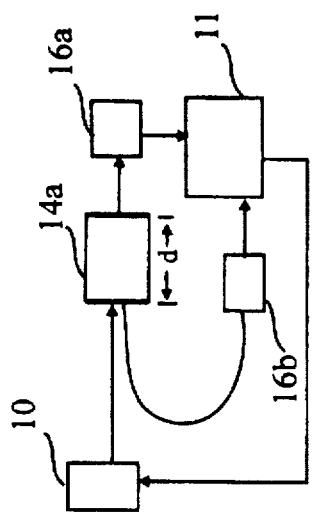
FIG. 2 is an alternative embodiment of a wavelength locking system with a single optical element having a periodic wavelength response.

Turning now to FIG. 2, an alternative embodiment is shown, whereby a single etalon is used in a similar manner to that of FIG. 1. However, in FIG. 2 detectors 16a and 16b are coupled to different sides of the same etalon 14a. This embodiment is similar in function to that of the previous embodiments; in FIG. 2 light that is transmitted through the etalon has a first amplitude response, and the remaining light that is coupled to an output port on the input end face of the etalon will have a different amplitude response when the wavelength is not locked. In the instance where the input signal is locked, at for example 1550 nm, as is shown in FIG. 4a, the detectors 16a and 16b shown in FIG. 2 detect the same intensity of light. The curves shown in FIG. 4a show the intensity at the input and output end faces respectively as is illustrated by curves 22 and 24. When the wavelength is not locked, the amplitude response at the two detectors 16a and 16b will differ. Of course, what is determined to be a locked state need not be the instance wherein the two detectors detect the same intensity as long as a calibration techniques account for a difference in detected amplitudes.

In both embodiments described heretofore, manufacture of the device can be conveniently realized, by utilizing a precise stable input signal having a desired locking wavelength. By transmitting this stable input signal into the device, the etalons can be modified to yield a desired output response. For example the spacing "d" between the partially reflecting surfaces of the etalon can be adjusted in such a manner as to obtain balanced detected output signals on the two detectors 16a and 16b; or, instead of physically varying the distance "d", the effective distance of the path taken by the light entering the etalon can be varied by changing the input angle of incident light entering the etalon. The wavelength shift is given by $\lambda = \lambda^\circ \cos \theta$, where $\lambda^\circ$ is the wavelength of a transmission peak at normal incidence, $\theta$ is the beam angle in the medium between the etalon mirrors, and $\lambda$ is the wavelength of the transmission peak at a beam angle $\theta$.

In the instance wherein air or another gas is used in the space between the mirrors, a change in density or composition (pressure, temperature, or humidity) will affect the refractive index n of the air or medium, affecting the locking wavelength.

Thus, it is preferred to have the gas sealed or controlled to prevent wavelength drifting. An effective seal can be achieved by making a ring-shaped spacer to which transparent end-plates with the mirror coatings on the inner surfaces are attached with an airtight seal; one suitable method of attachment being "optical contacting".

It is preferred that the spacer material have a low thermal expansion coefficient $\alpha$ to reduce wavelength drifting $\Delta\lambda$ due to changes in temperature $\Delta T$ $$\Delta\lambda = \Delta T \alpha \lambda$$

Suitable materials are fused silica ($\alpha \cong 5 \times 10^{-7} °C.^{-1}$); $\Delta\lambda/\theta T \cong 0.8$ pm/°C. at 1550 nm. or Zerodur™ ($\alpha \cong 1 \times 10^{-7} °C.^{-1}$) where $\Delta\lambda/\theta T \approx 0.15$ pm/°C.; both of these materials are suitable for optical contacting. Notably, the temperature drift is much less than it is for the prior art, therefore temperature control may not be necessary.

Figure 3:
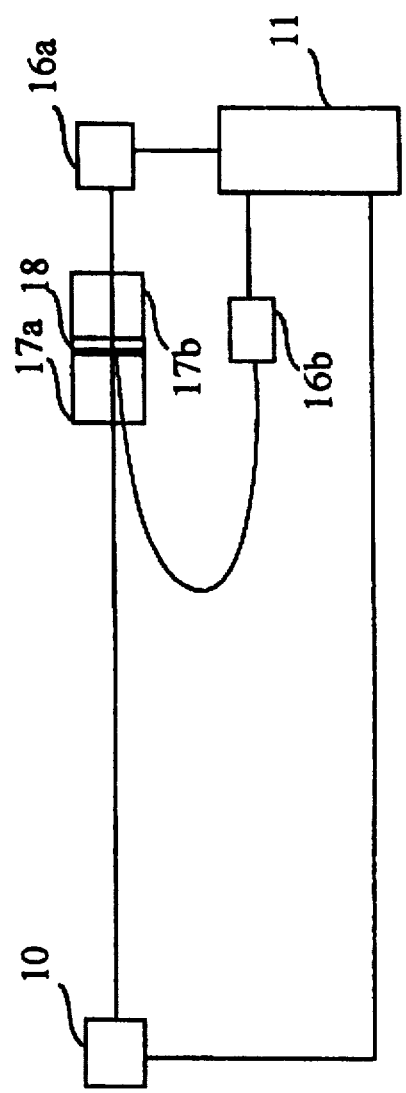
FIG. 3 is an alternative embodiment of a wavelength locking system utilizing an optical filter in transmission and reflection mode.

Referring now to FIG. 3, an alternative embodiment of the invention is shown whereby a non-periodic filter element 18 is utilized in place of an etalon previously shown. The output response of the filter in transmission is shown in FIG. 5 by curve 29. The output response of the filter 18 in reflection is shown by curve 28. The intersecting point of the two curves at 1550 nm, the desired locking wavelength in this example, yields a balanced output signal at both of the detectors 16a and 16b.

The periodic device in the form of a Fabry Perot etalon, described heretofore, offers distinct advantages over the non-periodic filter 18. For example, the etalon 14a may be used to provide a stable output for an input signal having an unknown wavelength. The arrangement of FIG. 3 is only practicable in the operating range of the filter. Furthermore, the device shown in FIG. 1 can be used to lock a number of spaced channels, wherein the channel spacing corresponds to a multiple FSR of the etalon.

Figure 6:
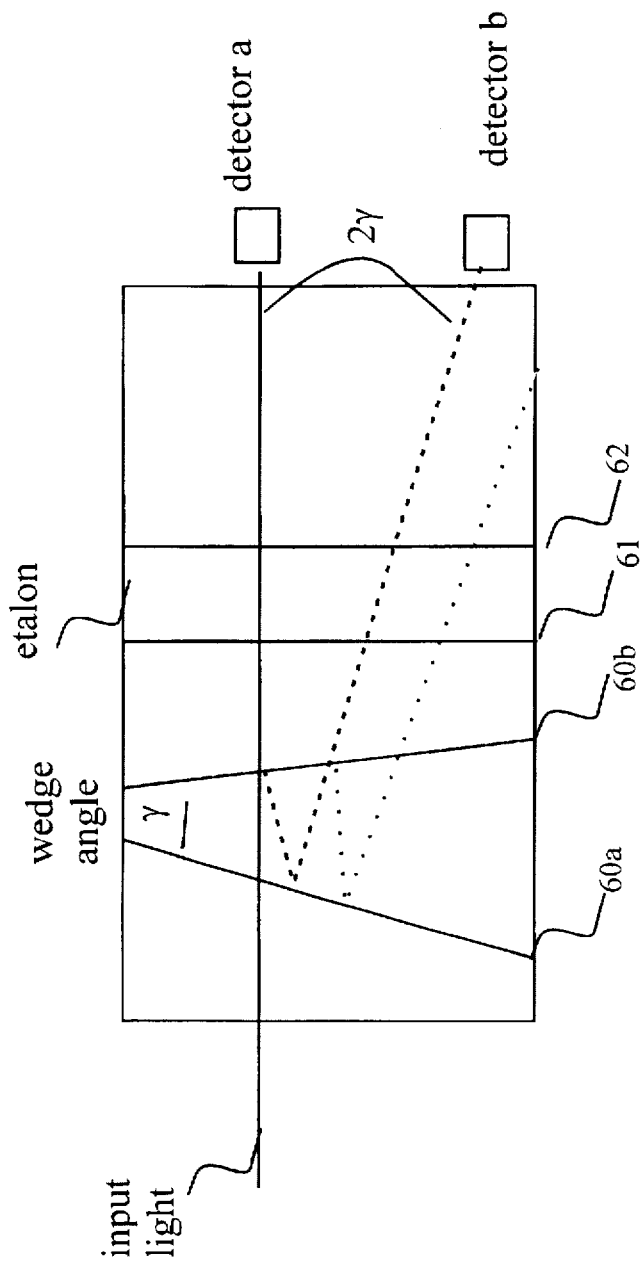

Turning now to FIG. 6, a monolithic device is shown having partially transmitting mirrors 60a and 60b forming a wedge at an angle $\gamma$. Adjacent to and spaced from the wedge is an etalon formed by two spaced partially reflecting mirrors 61 and 62. Two detectors a and b are positioned, separated by an angle 2$\gamma$ to detect two beams. Conveniently, the monolithic device only requires a single etalon and is relatively compact. A first beam traveling along a straight through path traverses the etalon such that the beam angle through the etalon mirrors is different than that of the angle of the second beam directed at detector b. Hence the two detector responses will be different as in FIG. 4a. Some light shown in dotted outline is not coupled to either of the detectors a or b, and is lost. The straight through beam suffers transmission loss on passing through mirrors 60a and 60b. The first reflected beam suffers transmission loss from mirrors 60a and 60b, but also suffers loss on one reflection from each of 60a and 60b. Thus the output response when the device is determined to be locked will likely be such that the detectors a and b detect a different intensity. Therefore, pre-calibration may be used to determine the difference in amplitude of the signals received at the detectors a and b as a result of the geometry of the monolithic device. Feedback circuitry (not shown) is provided in the form a comparator circuit which compares the detected intensities at the two detectors a and b. When the ratio of the intensities varies more than a predetermined amount from a pre-established ratio determined by pre-calibration, the wavelength of the input signal is adjusted accordingly.

One advantage of the device of FIG. 6 is that the wavelength difference between the responses of detectors a and b can be adjusted by varying the angle of the input beam in the plane of the page, and the average wavelength or locking wavelength can be adjusted by varying the angle of the input beam in a direction out of the plane of the page. Thus, it is not necessary to have absolute control over the wedge angle $\gamma$ or the etalon mirror spacing "d".

Of course, numerous other embodiments may be envisage without departing from the spirit and scope of the invention.

What we claim is:

1. A method of maintaining a frequency of an optical signal to within predetermined limits comprising, the steps of:

a) providing an input beam which is at least a portion of the optical signal;

b) splitting the input beam into at least two beams propagating in a substantially same direction along non-parallel paths;

c) directing the at least two beams to an optical cavity that has a first natural resonating frequency in such a manner as to have one beam traverse a longer path than the other through the optical cavity, the cavity having an input end, and an output end;

b) detecting an intensity of the optical signal emitted at two locations from the output end; and e) comparing a relative intensity of the optical signal detected to determine if a frequency is within predetermined limits; and, f) adjusting the frequency of the optical signal if the frequency is not within predetermined limits.

2. A device for indicating a change in an optical wavelength comprising:

means having at least one input port for receiving at least one input optical signal and two output ports for generating two output optical; said means having a periodic wavelength dependent characteristic such that by varying the wavelength an input optical signal presented to the input will effect a change in a characteristic of at least one of the two output optical signals;

and detector means for detecting an intensity of the two output optical signals; and comparator means for comparing the intensity of the two output optical signals, wherein the device comprises means for splitting the input signal coupled to the at least one input port, into two signals propagating in a non-parallel manner, and comprising a single etalon for receiving the two optical signals.

3. A device as defined in claim 2, wherein said means having a periodic wavelength dependent characteristic comprises a signal Fabry Perot optical cavity.

4. A device as defined in claim 2, wherein path lengths across the single Fabry Perot optical cavity for the two optical signals are unequal.

5. A device for indicating a change in an optical wavelength comprising:

an input portion for inputting an input optical beam;

a wedged portion having an end face that is partially transmissive and partially reflective;

a Fabry Perot etalon adjacent from the wedged portion and disposed to receive two optical beams from the wedged portion, the two optical beams being two portions of the input optical beam;

detector means adjacent the etalon for simultaneously detecting an intensity of the two optical beams; and, comparator means for comparing the intensity of the two optical beans after they have passed through the etalon, wherein the wedged portion is for splitting the input optical beam into the two optical beams and for directing the in toward the etalon so that they propagate in a non-parallel manner through the etalon.

6. A device as defined in claim 5, further wherein the wedged shaped portion is for directing the two optical beams through the etalon such that they traverse paths of different lengths though the etalon.

7. A method of maintaining a frequency of an optical signal to within predetermined limits comprising the steps of:

providing an optical cavity having a first natural resonating frequency;

directing at least a first portion of the optical signal and a second different portion of the optical signal into the optical cavity along two different non-parallel paths in such a manner as to have the first portion of the optical signal traverse a longer path than the second portion of the optical signal traversing through the optical cavity, the cavity having an input end and an output end;

detecting an intensity of the optical signal emitted at two locations from the output end; and comparing a relative intensity of the optical signal detected at the two locations to determine if a frequency is within predetermined limits; and, adjusting the frequency of the optical signal if the frequency is not within predetermined limits.

8. The method as defined in claim 7, wherein the optical cavity is a Fabry-Perot etalon.

* * * * *

UNITED STATES PATENT AND TRADEMARK OFFICE
CERTIFICATE OF CORRECTION

PATENT NO. : 5,798,859
DATED : August 25, 1998
INVENTOR(S) : Paul Colbourne, et al.

It is certified that error appears in the above-identified patent and that said Letters Patent is hereby corrected as shown below:

Col. 2, line 44, "un" should read -- μm --

Col. 4, lines 3 and 4, "θ" should read -- Λ --

In claim 2, insert the word "signals;" after the first occurrence of -- output optical --.

Signed and Sealed this

Twenty-sixth Day of January, 1999

Attest:

*Attesting Officer*    *Acting Commissioner of Patents and Trademarks*